(12) United States Patent
Huang et al.

(10) Patent No.: US 7,074,700 B2
(45) Date of Patent: Jul. 11, 2006

(54) METHOD FOR ISOLATION LAYER FOR A VERTICAL DRAM

(75) Inventors: Cheng-Chih Huang, Taipei (TW);
Sheng-Wei Yang, Taipei (TW);
Chen-Chou Huang, Taipei (TW);
Sheng-Tsung Chen, Tainan (TW)

(73) Assignee: Nanya Technology Corporation, Taoyuan (TW)

( * ) Notice: Subject to any disclaimer, the term of this patent is extended or adjusted under 35 U.S.C. 154(b) by 160 days.

(21) Appl. No.: 10/943,699

(22) Filed: Sep. 17, 2004

(65) Prior Publication Data

US 2005/0064643 A1 Mar. 24, 2005

(30) Foreign Application Priority Data

Sep. 18, 2003 (TW) .............................. 92125706 A

(51) Int. Cl.
*H01L 21/22* (2006.01)
(52) U.S. Cl. ...................... 438/593; 438/268; 438/270; 438/282
(58) Field of Classification Search ................ 438/268, 438/270, 282, 290, 291, 525, 527, 593
See application file for complete search history.

(56) References Cited

U.S. PATENT DOCUMENTS 6,930,004 B1 * 8/2005 Wang et al. ................. 438/268

FOREIGN PATENT DOCUMENTS

TW 439268 6/2001

* cited by examiner

*Primary Examiner*—Mai-Huong Tran
(74) *Attorney, Agent, or Firm*—Quintero Law Office

(57) ABSTRACT

A method for forming isolation layer in a vertical DRAM. A semiconductor substrate with a plurality of first trenches is provided, with a collar dielectric layer is formed on a sidewall of each, and each filled with a first conducting layer. A patterned mask layer is formed on the semiconductor substrate, and the semiconductor substrate is etched using the patterned mask layer as an etching mask to form a plurality of second trenches. The patterned mask layer is removed. Each second trench is filled with an insulating layer acting as an isolation. Each of first conducting layers is etched to form a plurality of grooves. A doped area acting as a buried strap is formed in the semiconductor substrate beside each groove. A trench top insulating layer is formed in the bottom surface of each trench. Each first trench is filled with a second conducting layer acting as a gate.

22 Claims, 15 Drawing Sheets

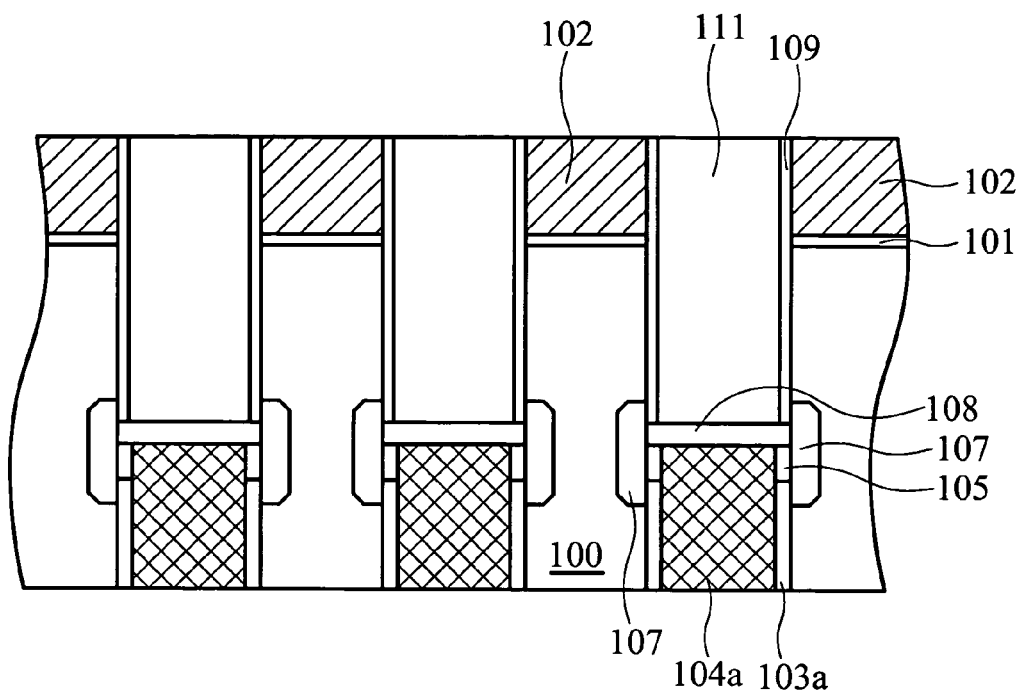
FIG. 1e(a) (RELATED ART)
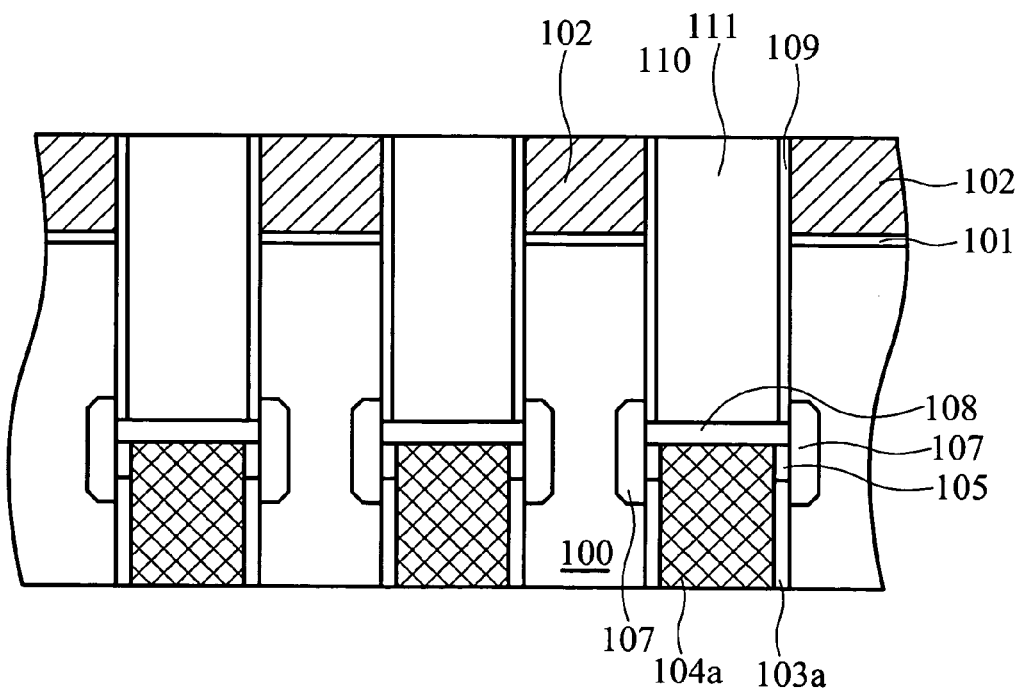
FIG. 1e(b) (RELATED ART)

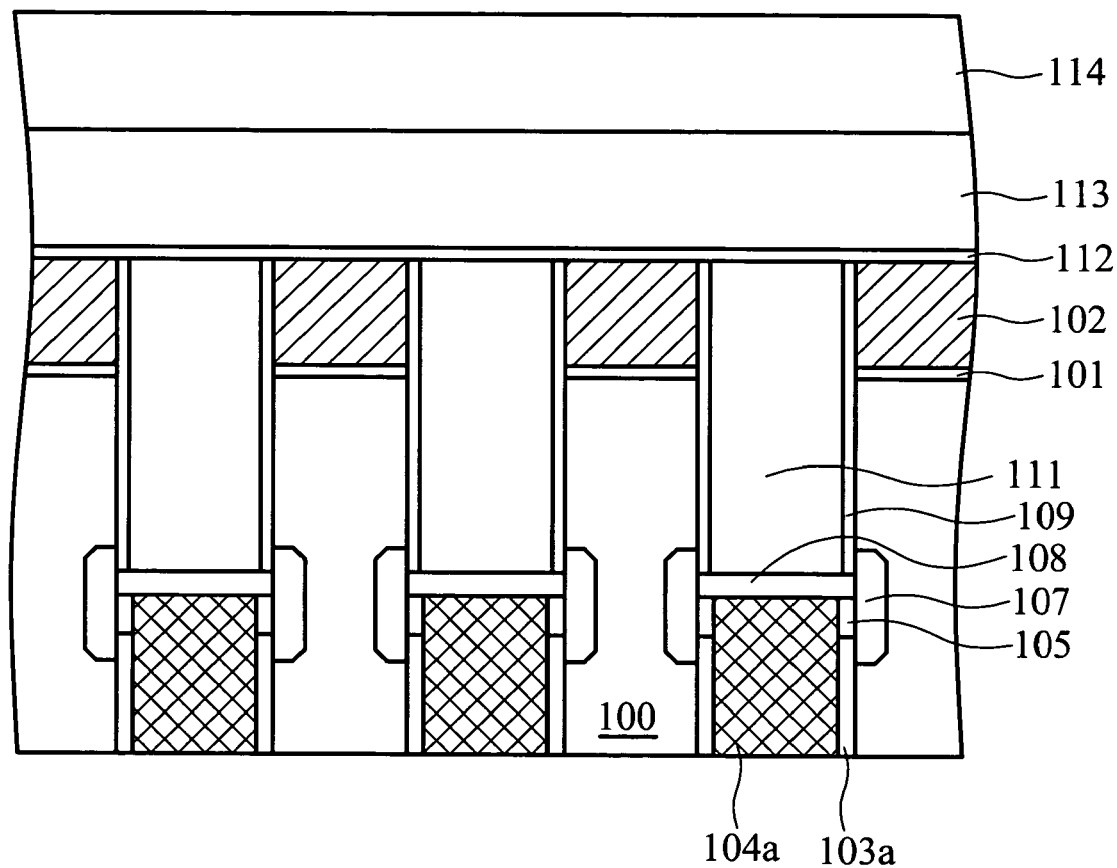
FIG. 1f(a) (RELATED ART)

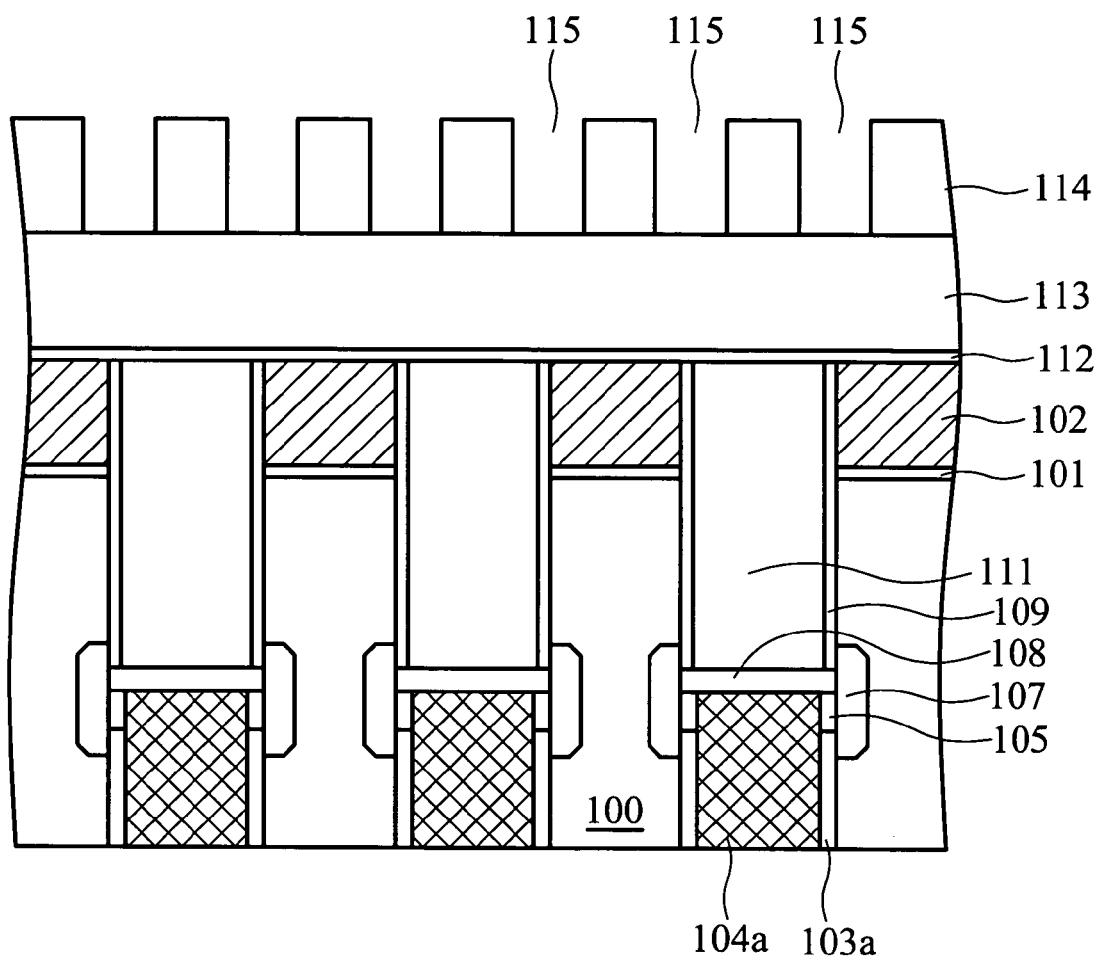
FIG. 1f(b) (RELATED ART)

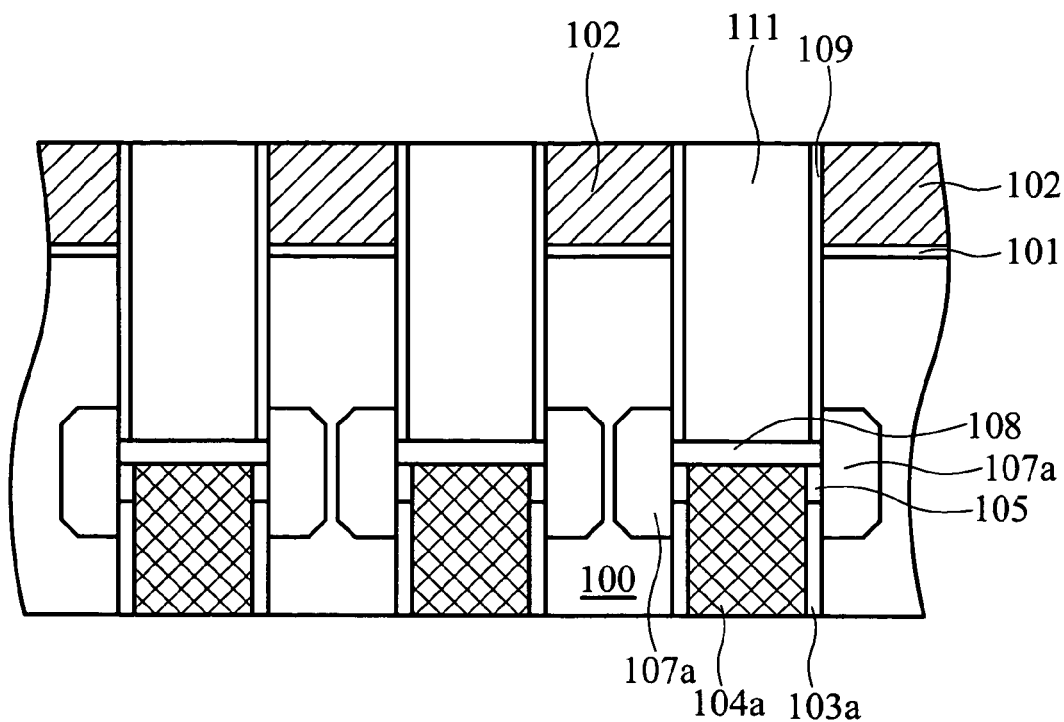
FIG. 1g(a) (RELATED ART)
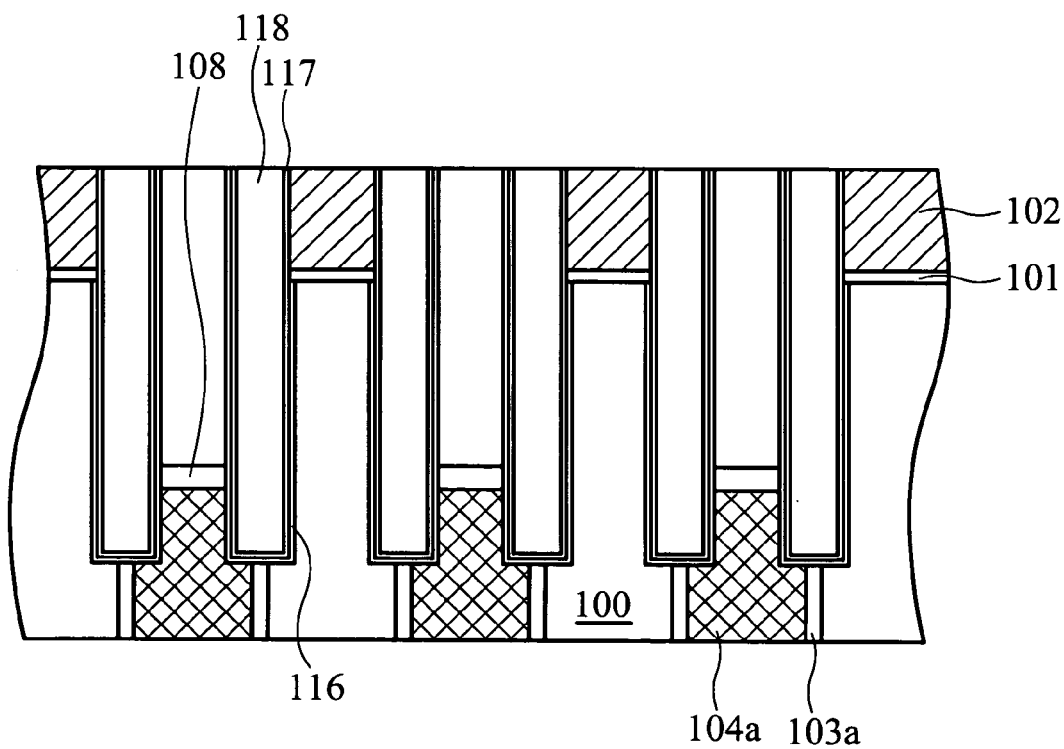
FIG. 1g(b) (RELATED ART)

METHOD FOR ISOLATION LAYER FOR A VERTICAL DRAM

BACKGROUND OF THE INVENTION

1. Field of the Invention

The invention relates to a method for isolation of a vertical DRAM, and more particularly to a method for improving DRAM quality by reversing the order of formation of a memory cell and isolation layer.

2. Description of the Related Art

Memory devices, such as Dynamic Random Access Memory (DRAM), for non-volatile storage of information, are currently in widespread use, in a myriad of applications.

A conventional DRAM consists of a transistor and a capacitor, with electric charges entering or leaving the capacitor during reading and writing. A deep trench capacitor is normally used to reduce the size of the memory device. The capacitor is disposed in the deep trench bottom, the transistor is disposed at the deep trench top, and a thick dielectric layer, such as trench top oxide (TTO) layer, acting as an electrical insulating layer, is disposed between the capacitor and the transistor.

FIGS. 1a to 1g are cross-sections of the conventional method for forming an isolation layer in a vertical DRAM. FIG. 3 is a top view of a vertical DRAM array, FIGS. 1e(a) to 1g(a) are cross-sections along line 11, and FIGS. 1e(b) to 1g(b) are cross-sections along line 22.

In FIG. 1a, a semiconductor substrate 100 is provided, on which a pad oxide layer 101, a pad nitride layer 102, and a patterned mask layer 400 with an opening 401 are formed, with the location of the opening 401 corresponding to a trench described subsequently. The pad oxide layer 101 and pad nitride layer 102 act as hard mask layers for etching the semiconductor substrate 100 to form a trench.

In FIG. 1b, the pad nitride layer 102 and the pad oxide layer are sequentially etched using the patterned mask layer 400 as an etching mask to form an opening, and the semiconductor substrate 100 is etched using the pad nitride layer 102 and the pad oxide layer 101 with the opening as etching masks to form a trench 100a. The trench 100a, deep in the semiconductor substrate 100, acts as a buried DRAM described in subsequent.

In FIG. 1c, a trench capacitor is disposed in the bottom portion of the trench 100a, comprising a buried plate, and a conformable capacitor dielectric layer and plate. A collar oxide layer 103 is formed on a sidewall of the trench 100a above the capacitor. A doped poly layer 104 is formed on the semiconductor substrate 100, and the trench 100a is filled, with the poly layer 104 acting as a capacitor wire.

In FIG. 1d, the poly layer 104 is etched to leave a poly layer 104a of a predetermined depth in the trench 100a.

In FIG. 1e, the collar oxide layer 103 is recessed lower than the surface of the poly layer 104a to form a groove 105. A trench top oxide (TTO) layer 108 is formed on the poly 104a to isolate the trench capacitor and a gate described in subsequently. The semiconductor substrate 100 is annealed to diffuse the dopant from the poly layer 104a to the semiconductor substrate 100 via the groove 105, and thus an ion doped area 107 is formed in these semiconductor substrate 100. The ion doped area 107 acts as a buried strap to electrically connect the conducting layer 104a and the gate of the transistor, and acts as a drain of the transistor described in subsequently. A gate oxide 109 is conformably formed on a sidewall of the trench 100a, a poly layer lower than the surface of the pad nitride layer 102 is formed in the trench 100a, and another poly layer level with the pad nitride layer 102 is formed in the trench, completing poly layer 111 acting as the gate.

FIG. 1f(a) is a cross-section along line 11, and FIG. 1f(b) is a cross-section along line 22. A nitride layer 112, a borosilicate glass (BSG) layer 113, and a patterned photoresist layer 114 with a plurality of openings 115 are sequentially formed on the surface of the pad nitride layer 102 and the poly layer 111. The BSG layer 113 acts as a hard mask layer for forming a high quality trench, and the surface of the BSG layer 113 is exposed by the openings 115.

In FIGS. 1g(a) and 1g(b), the BSG layer 113 is etched using the patterned photoresist layer 114 to expose the nitride layer 112.

After the patterned photoresist layer 114 is removed, the nitride layer 112, the exposed pad nitride layer 102, the pad oxide layer 101, the exposed structures, and semiconductor substrate 100, are sequentially etched using the BSG layer 113 as an etching mask to form a deep trench in the semiconductor substrate 100.

Thermal oxidation is performed to form a liner oxide layer 116 on the exposed semiconductor substrate 100 in the trench, and a liner nitride layer 117 is conformably formed on the liner oxide layer 116. An oxide layer is formed on the nitride layer 112, and the trench is filled with oxide layer. The oxide layer is chemical mechanical polished (CMP) to expose the nitride layer 112, such that an isolation 118 is formed in the trench, and, the nitride layer is removed. The isolation layer 118 is thus complete, and an active area therebetween is defined.

However, the thermal oxidation forming the liner oxide layer 116 also subjects thermal energy on the ion doped area 107, such that the region of the ion doped area 107 is expanded to an ion doped area 107a, adjacent areas of which may overlap, such that the ion doped areas 107 are shortened.

SUMMARY OF THE INVENTION

The present invention is directed to a method for forming isolation layer in a vertical DRAM, and DRAM quality is improved by reversing the order of formation of a memory cell and isolation layer.

Accordingly, the present invention provides a method for forming isolation layer in a vertical DRAM. A semiconductor substrate with a plurality of first trenches is provided, a conformable collar dielectric layer is formed on a sidewall of each first trench, and a first conducting layer is formed in each of the first trenches. A pattern mask layer with a plurality of openings is formed over the semiconductor substrate, the collar dielectric layers, and the first conducting layers. The semiconductor substrate, the collar dielectric layers, and the first conducting layers are sequentially etched to form a plurality of second trenches. The patterned mask layer is removed. Each second trench is filled with an insulating layer act isolation layer. The first conducting layers are etched to a predetermined depth using the isolation layers as etching masks to form a plurality of grooves. Each groove is filled with a doped conducting layer. The doped conducting layers are diffused to form a doped area acting as a buried strap in the semiconductor substrate beside each groove. A trench top insulating layer is formed over the first conducting layers and the doped conducting layers. Each trench is filled with a second conducting layer acting as a gate.

Accordingly, the present invention also provides a method for forming isolation layer in a vertical DRAM. A semiconductor substrate is provided, and a mask layer is formed thereon. A plurality of first trenches is formed in the semiconductor substrate. A conformable collar dielectric layer is formed on a sidewall of each first trench, and each first trench is filled with a first conducting layer. A patterned mask layer with a plurality of openings is formed on the mask layer, the collar dielectric layers, and the first conducting layers. The mask layer, the collar dielectric layers, the first conducting layers, and the semiconductor substrate are sequentially etched using the patterned mask layer as an etching mask to form a plurality of second trenches. The patterned mask layer is removed. A liner layer is formed on a sidewall of each second trench. An insulating layer is formed on the semiconductor substrate, and each second trench is filled with the insulating layer. The insulating layer is planarized to leave the insulating layer in each second trench act isolation layer. Each of the first conducting layers is etched to a predetermined depth using the mask layer and the isolation layers as etching masks to form a plurality of grooves. Each groove is filled with a doped conducting layer, and the semiconductor substrate is diffused to form a doped area acting as a buried strap in the semiconductor substrate beside each groove. A top trench insulating layer is conformably formed on the surface of the mask layer and each first trench by high density plasma chemical vapor deposition (HDP CVD). Each top trench insulating layer on a sidewall of each first trench is removed. A gate dielectric layer is formed on the sidewall of each first trench. A second conducting layer is formed on the semiconductor substrate, and each of the first trenches is filled with the second conducting layer. The second conducting layer and each top trench insulating layer are sequentially planarized until the mask layer is exposed to leave the second conducting layer in each first trench acting as a gate.

BRIEF DESCRIPTION OF THE DRAWINGS

For a better understanding of the present invention, reference is made to a detailed description to be read in conjunction with the accompanying drawings, in which:

FIGS. 1a to 1d, 1e(a) to 1g(a), and 1e(b) to 1g(b) are cross-sections of a conventional method for forming a vertical DRAM.

DETAILED DESCRIPTION OF THE INVENTION

Figure 1A:
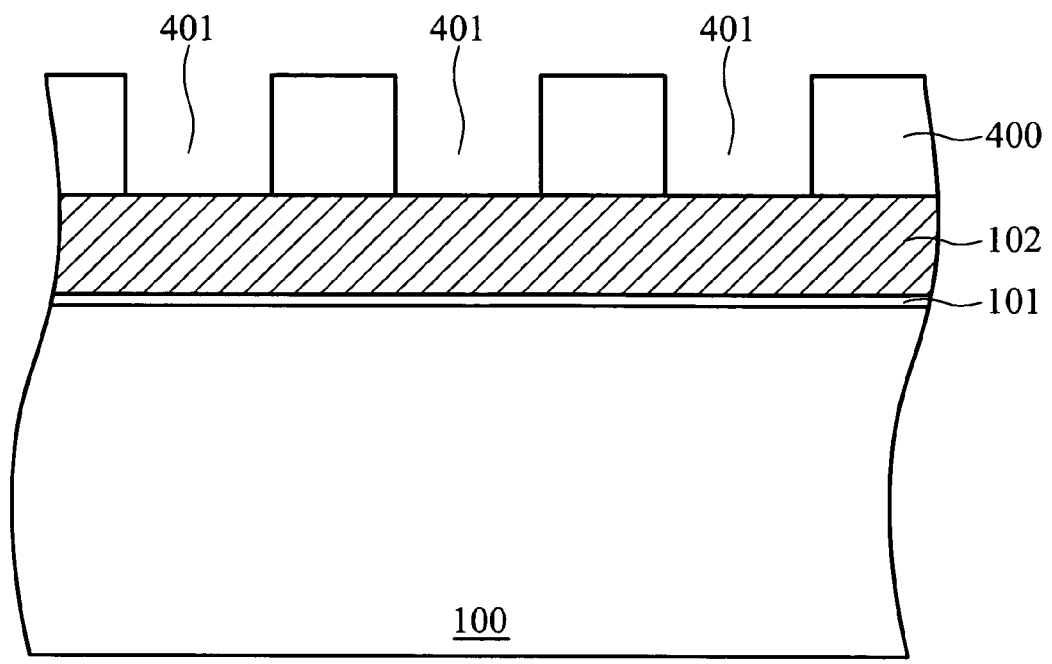
Figure 1B:
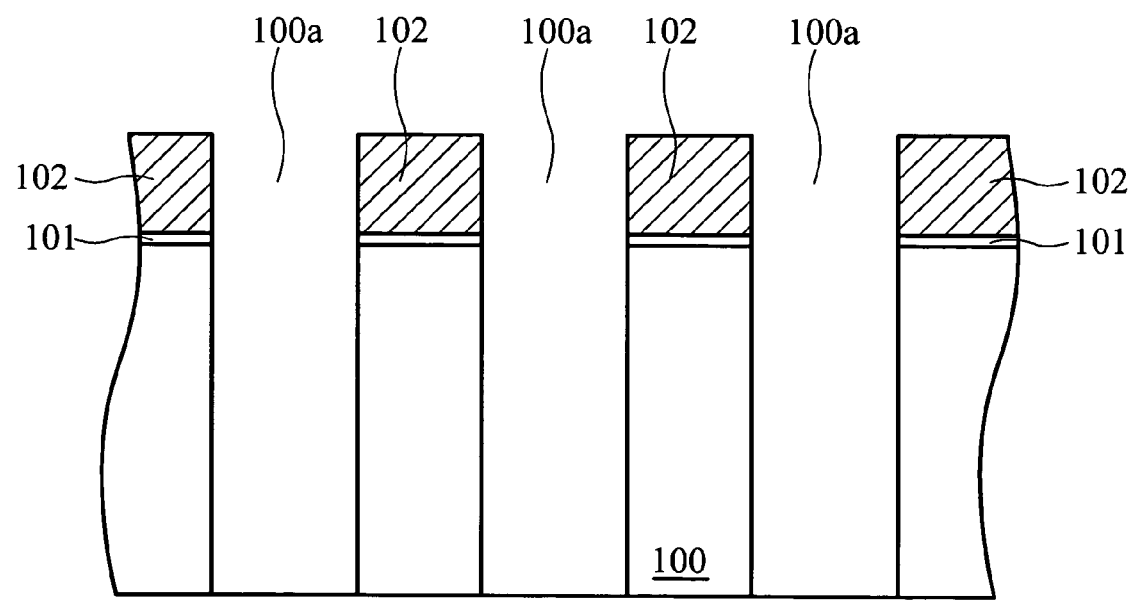
Figure 1C:
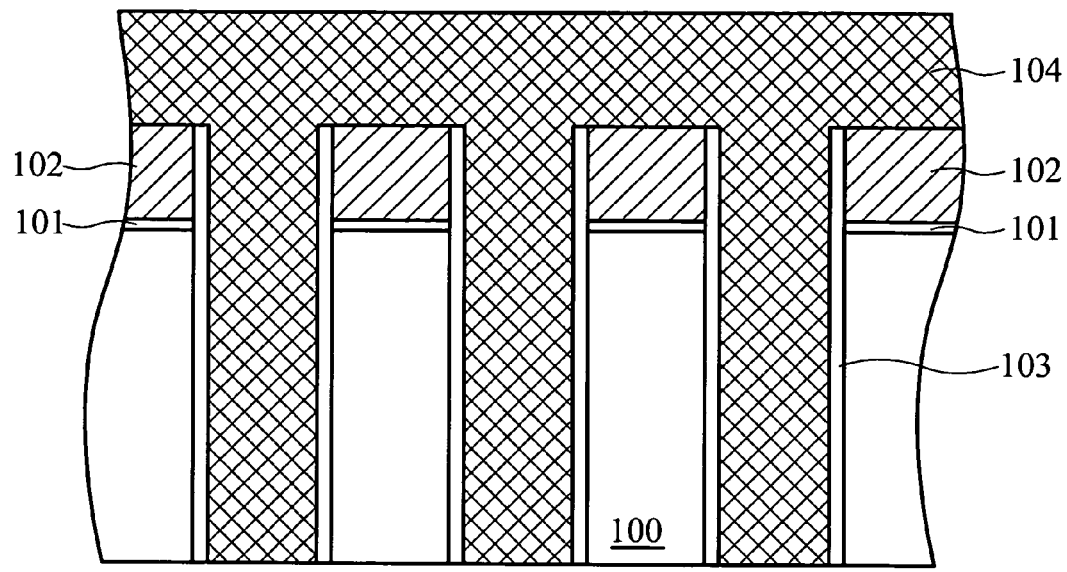
Figure 1D:
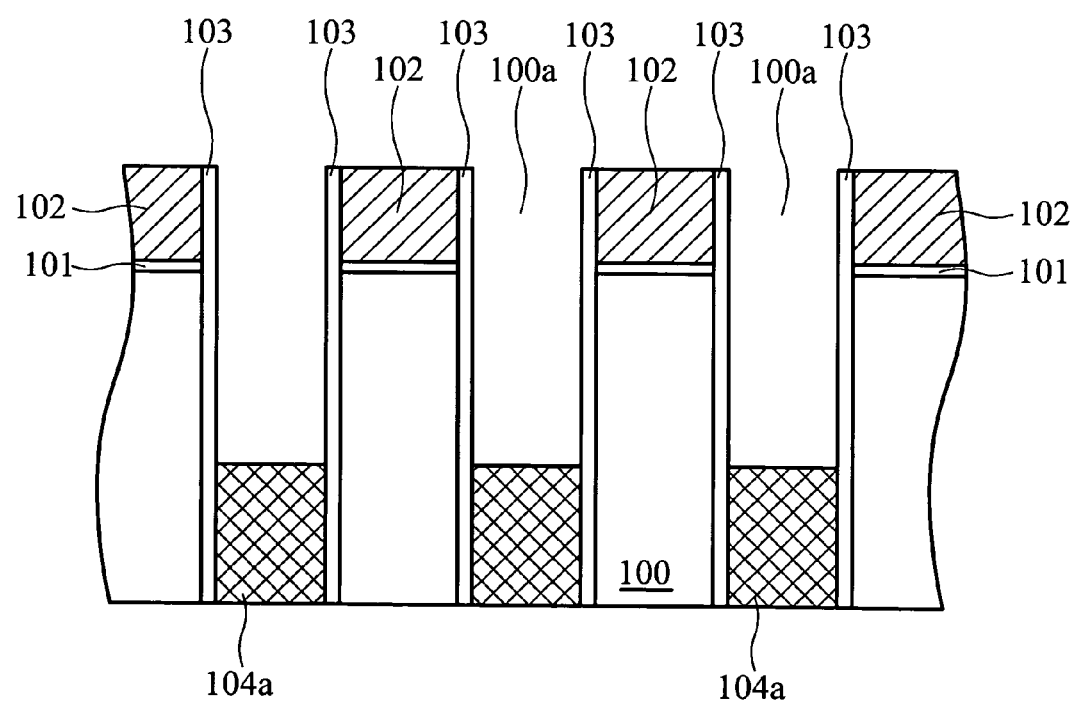
Figure 2A:
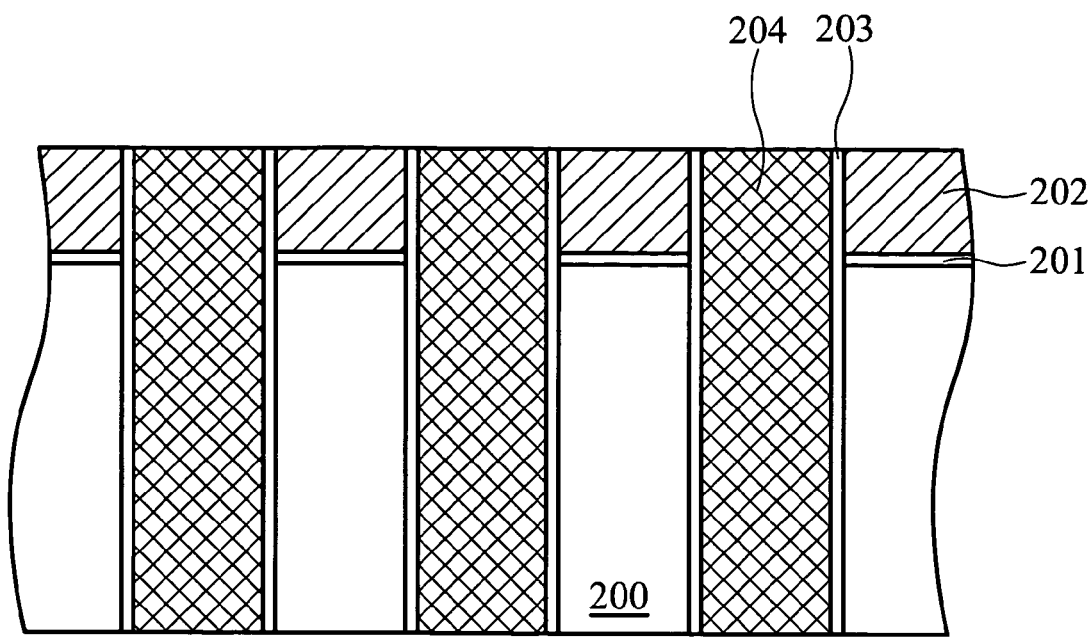
FIGS. 2a(a) to 2h(a), and 2a(b) to 2h(b) are cross-sections of a method for forming a vertical DRAM of the present invention.
Figure 2A:
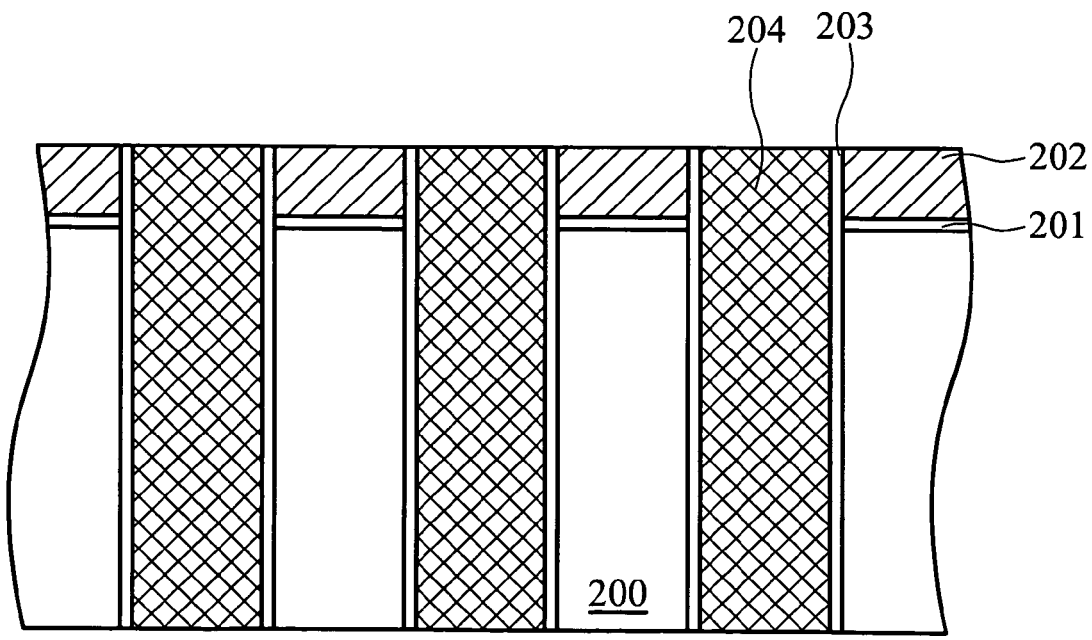
Figure 3:
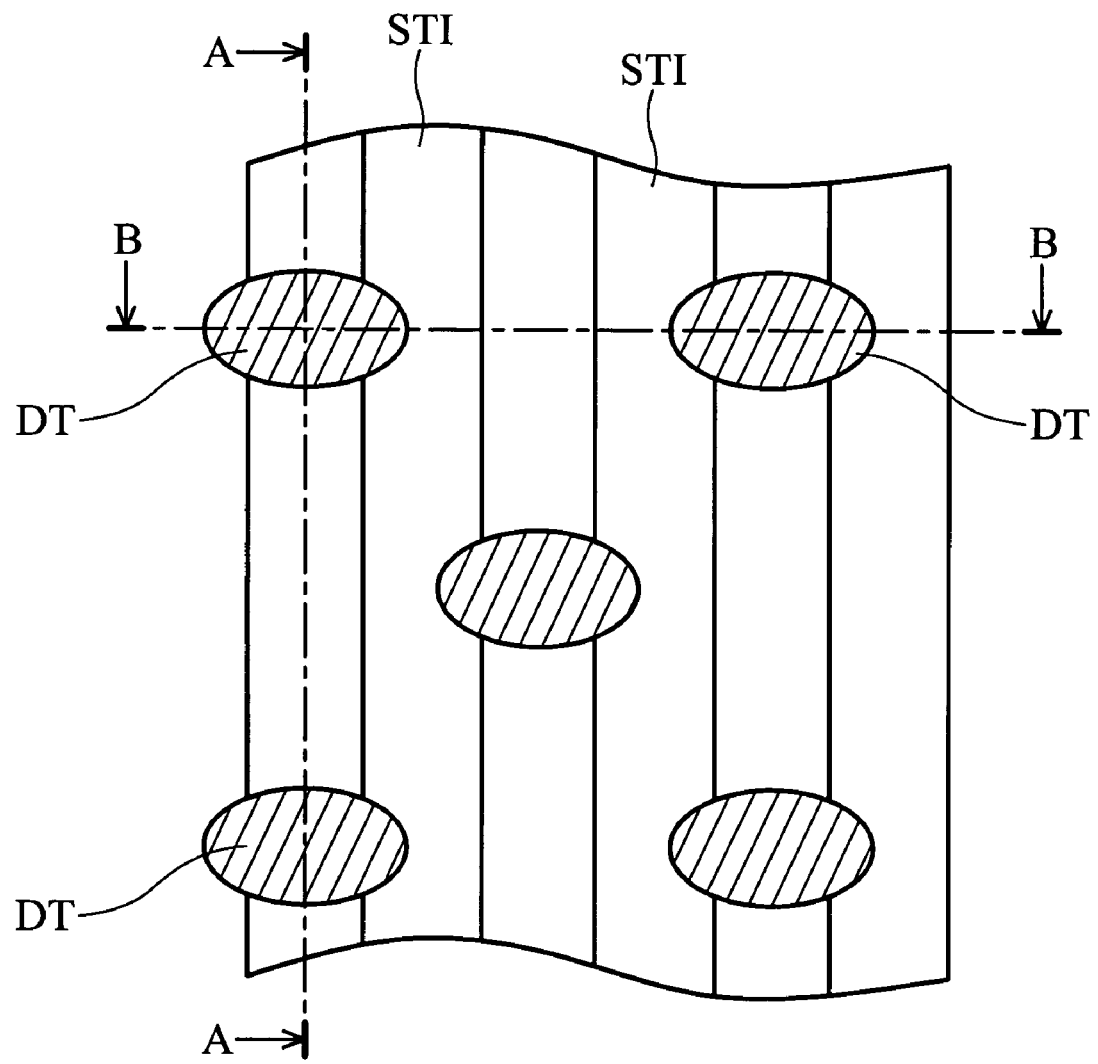
FIG. 3 is a top view of a vertical DRAM array.

FIGS. 2a(a) to 2h(a) and 2a(b) to 2h(b) are cross-sections of a method for forming a vertical DRAM of the present invention. FIG. 3 is a top view of a vertical DRAM array, FIGS. 2a(a) to 2h(a) are cross-sections along line 11, and FIGS. 2a(b) to 2h(b) are cross-sections along line 22.

Hereinafter, a method for forming a vertical memory unit is described.

In FIGS. 2a(a) and 2a(b), a semiconductor substrate 200 is provided. A pad oxide layer 201 and a pad nitride layer 202 are sequentially formed on the semiconductor substrate 200, and a hard mask layer and a patterned photoresist layer with an opening are sequentially formed on the pad nitride layer 202.

The hard mask layer is etched using the patterned photoresist layer as an etching mask to form a plurality of openings in the hard mask layer. After the patterned photoresist layer is removed, the pad nitride layer 202, the pad oxide layer 201, and the semiconductor substrate 200 are sequentially etched to form a plurality of trenches.

Afterward, a trench capacitor is disposed in the bottom portion of the trench, comprising a buried plate, and a conformable capacitor dielectric layer and plate.

A collar dielectric layer, such as a collar oxide layer 203, is conformably formed on a sidewall of the trench above the trench capacitor. A doped conducting layer 204, such as a poly layer, is formed on the semiconductor substrate 200, a trench in the semiconductor substrate 200 is filled with the conducting layer 204 acting as a capacitor wire.

Hereinafter, a method for forming an isolation between the vertical memory units is described.

Figure 2B:
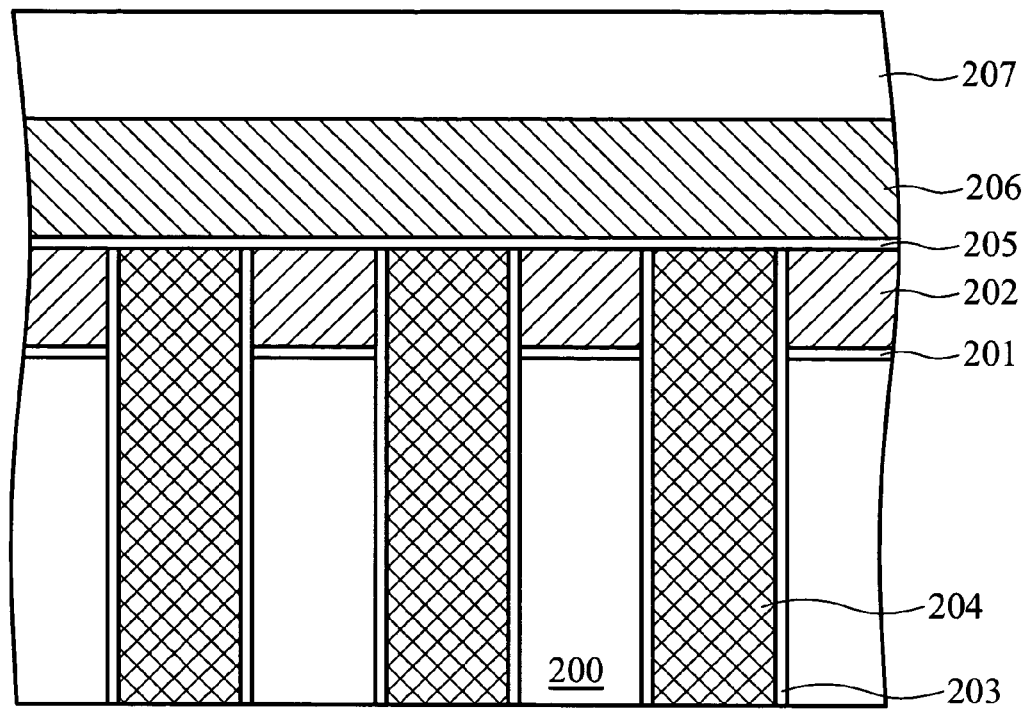
Figure 2B:
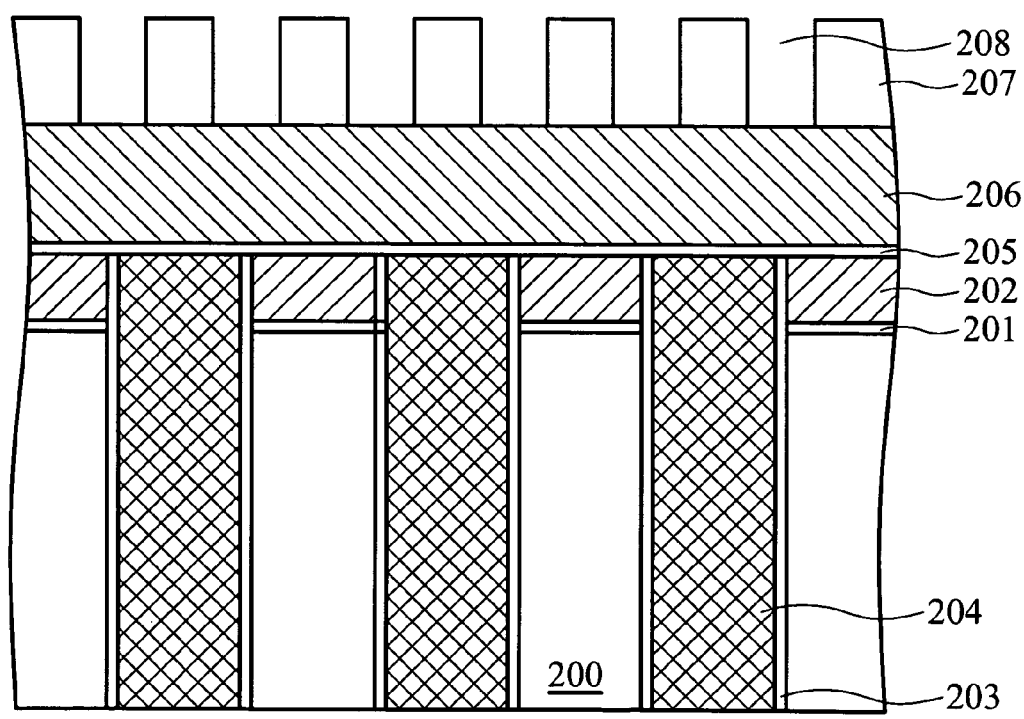
Figure 2C:
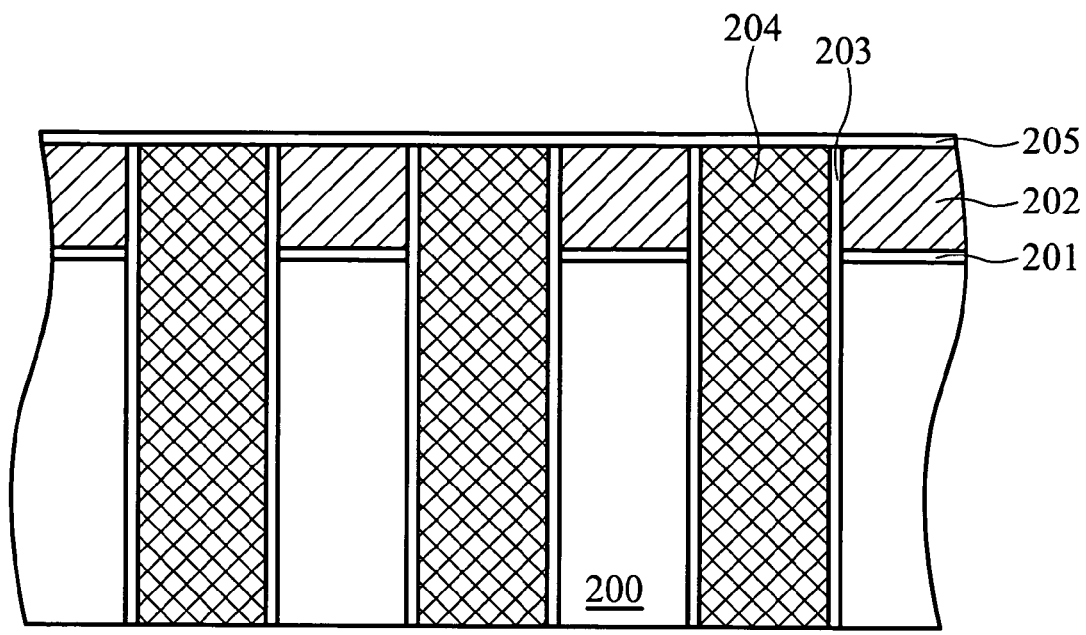
Figure 2C:
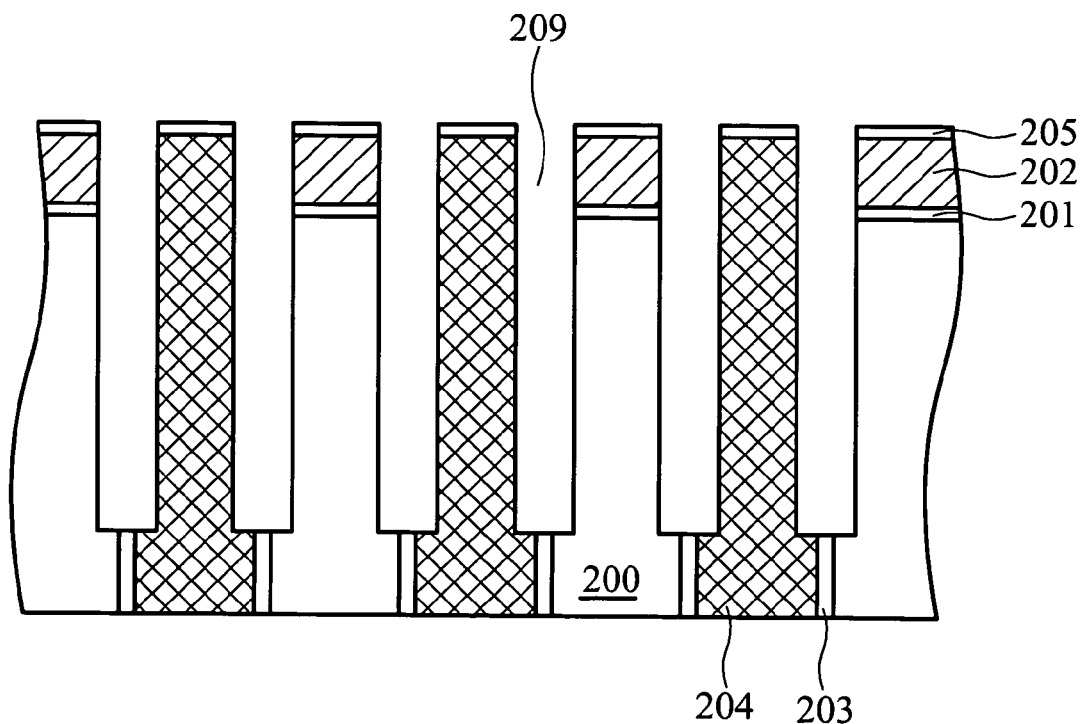

In FIGS. 2b(a) and 2b(b), a stop layer 205, such as a nitride layer, a BSG layer 206, and a patterned photoresist layer 207 with a plurality of openings are sequentially formed on the surface of the pad nitride layer 202 and the conducting layer 204. The BSG layer 206 acts as a hard mask layer for forming a high quality trench, and the surface of the BSG layer 206 are exposed by the openings 208. In FIGS. 2c(a) and 2c(b), the BSG layer 206 is etched using the patterned photoresist layer 207 as an etching mask to expose the stop layer 205.

After the patterned photoresist layer 270 is removed, the stop layer 205, the exposed pad nitride layer 202, the pad oxide layer 201, the exposed structures, and semiconductor substrate 200 are sequentially anisotropically etched by plasma etching or reactive ion etching using the BSG layer 206 as an etching mask to form a trench 209 deep in the semiconductor substrate 200. The BSG layer 206 is wet etched by HF. The conducting layer 204 is not etched by HF due to stop layer 205 being formed thereon.

Figure 2D:
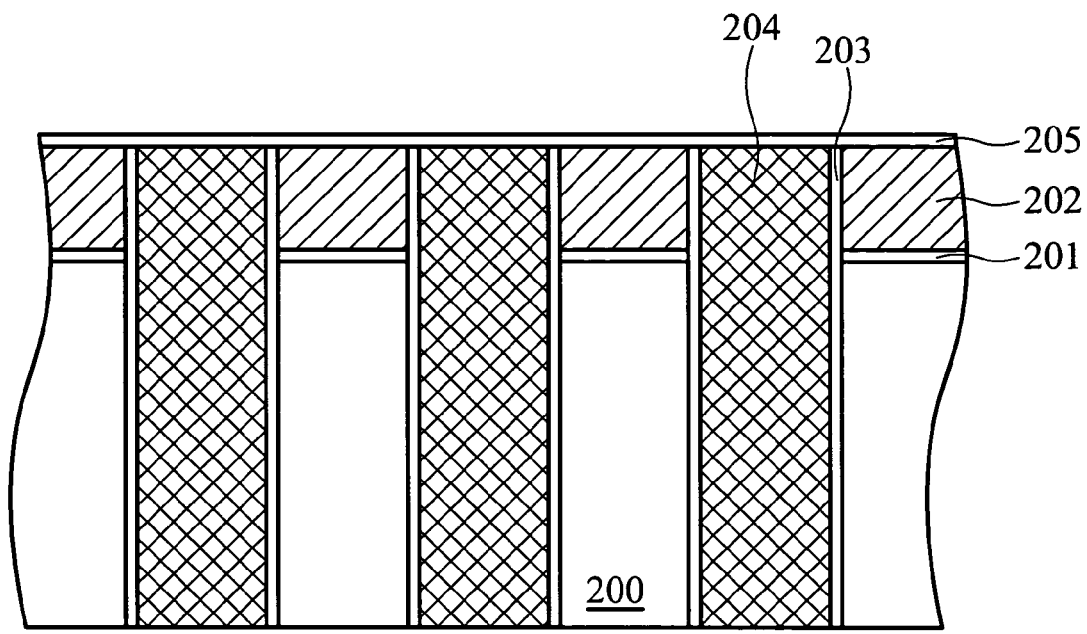
Figure 2D:
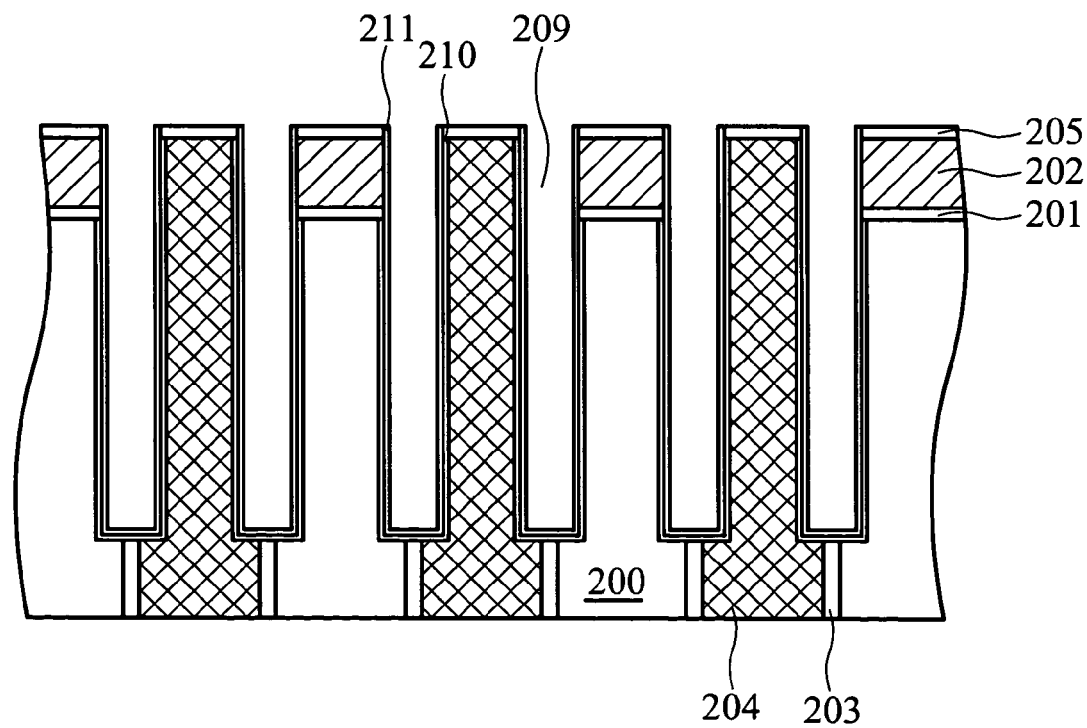

In FIGS. 2d(a) and 2d(b), the semiconductor substrate 200 is thermally oxidized at 800 to 1200° C. to form a liner oxide layer 210 on the exposed semiconductor substrate 200 2b in the trench 209, and a liner nitride layer 211 is conformably formed on the surface of the liner oxide layer 210 by CVD.

Figure 2E:
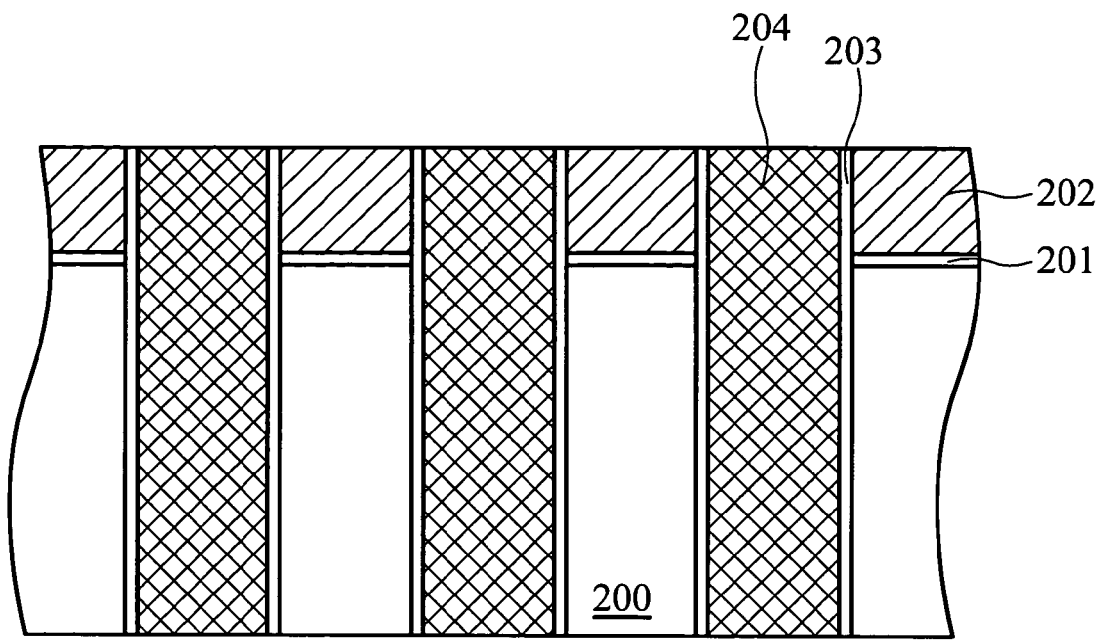
Figure 2E:
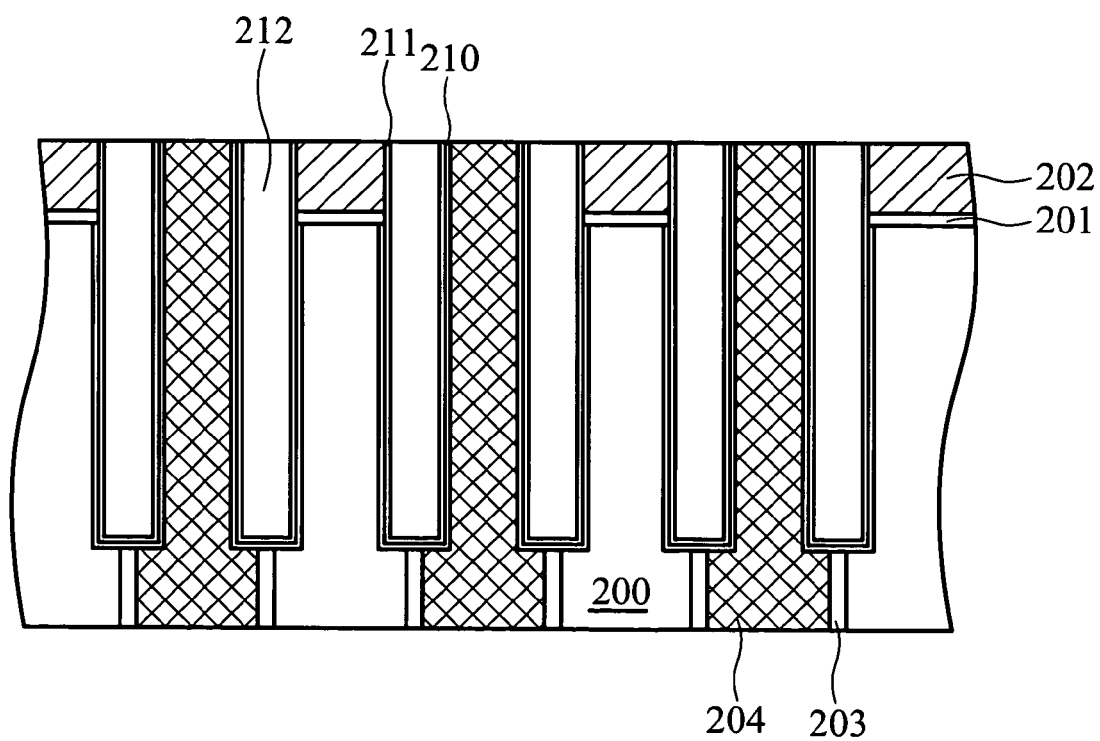

In FIGS. 2e(a) and 2e(b), a insulating layer, such as an oxide layer, is formed on the stop layer 205, and the trench 209 is filled with the insulating layer. The insulating layer is planarized by CMP until the nitride layer 205 is exposed, such that an isolation 212 is formed in the trench 209. The stop layer 205 is removed, completing the isolation 212 and defining an active area therebetween.

Figure 2F:
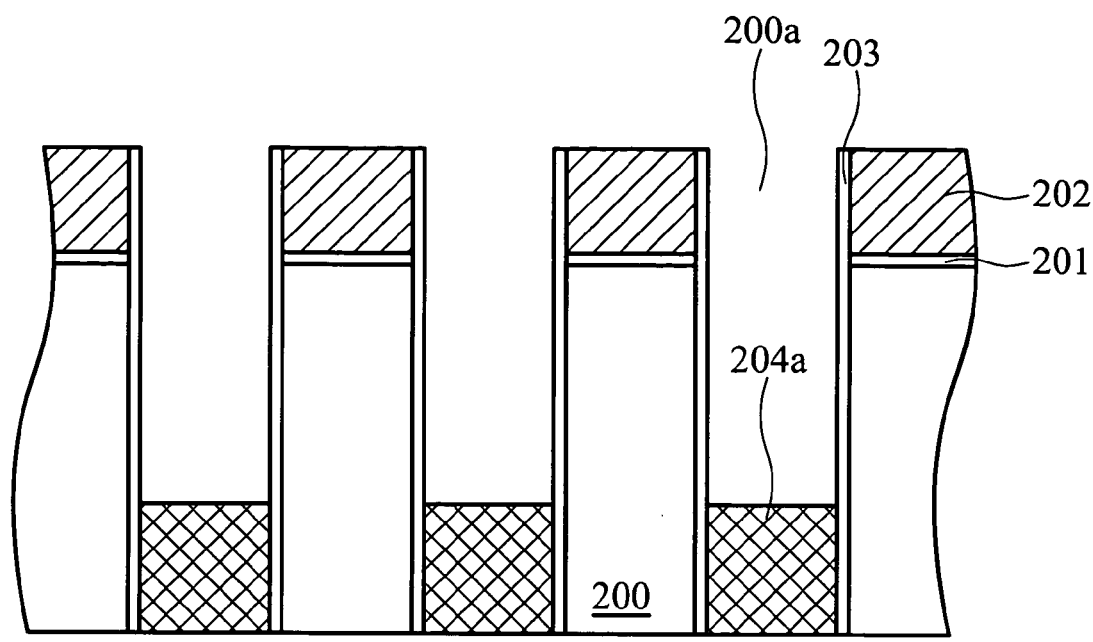
Figure 2F:
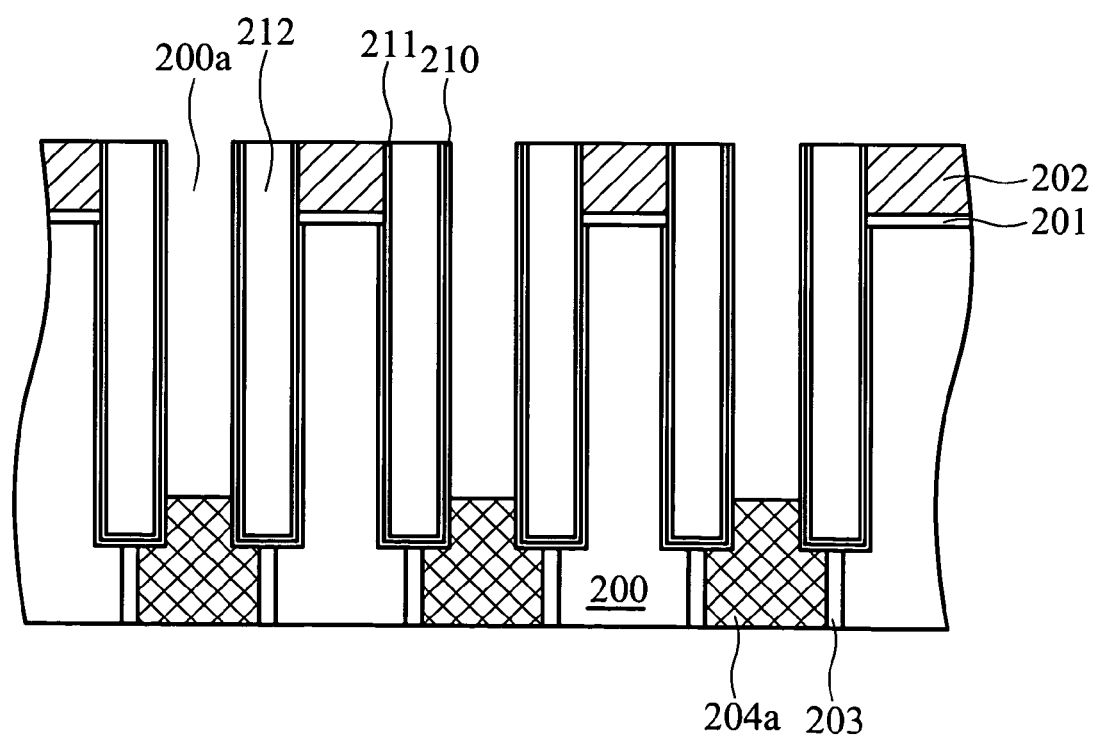

In FIGS. 2f(a) and 2f(b), the conducting layer 204 is etched using the pad nitride layer 202 and the isolation 212 as etching masks to leave a conducting layer 204a with a predetermined depth acting as a capacitor wire.

Hereinafter, a method for forming a vertical memory unit is described.

Figure 2G:
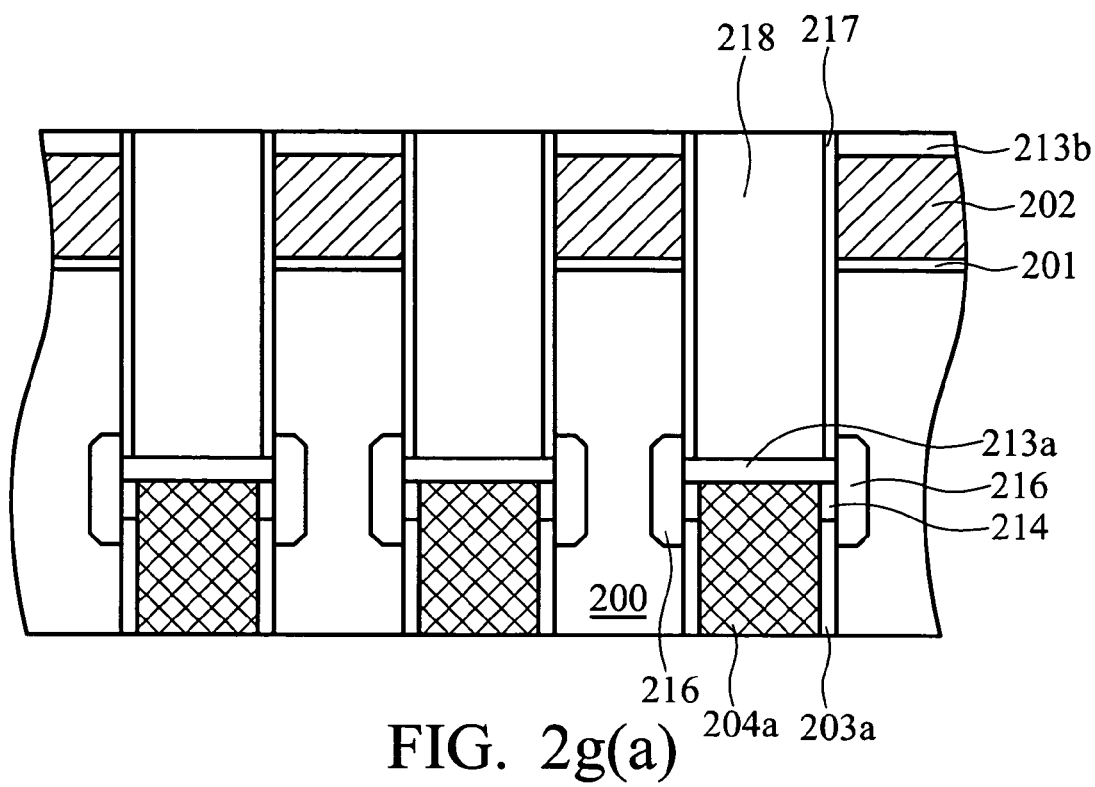
Figure 2G:
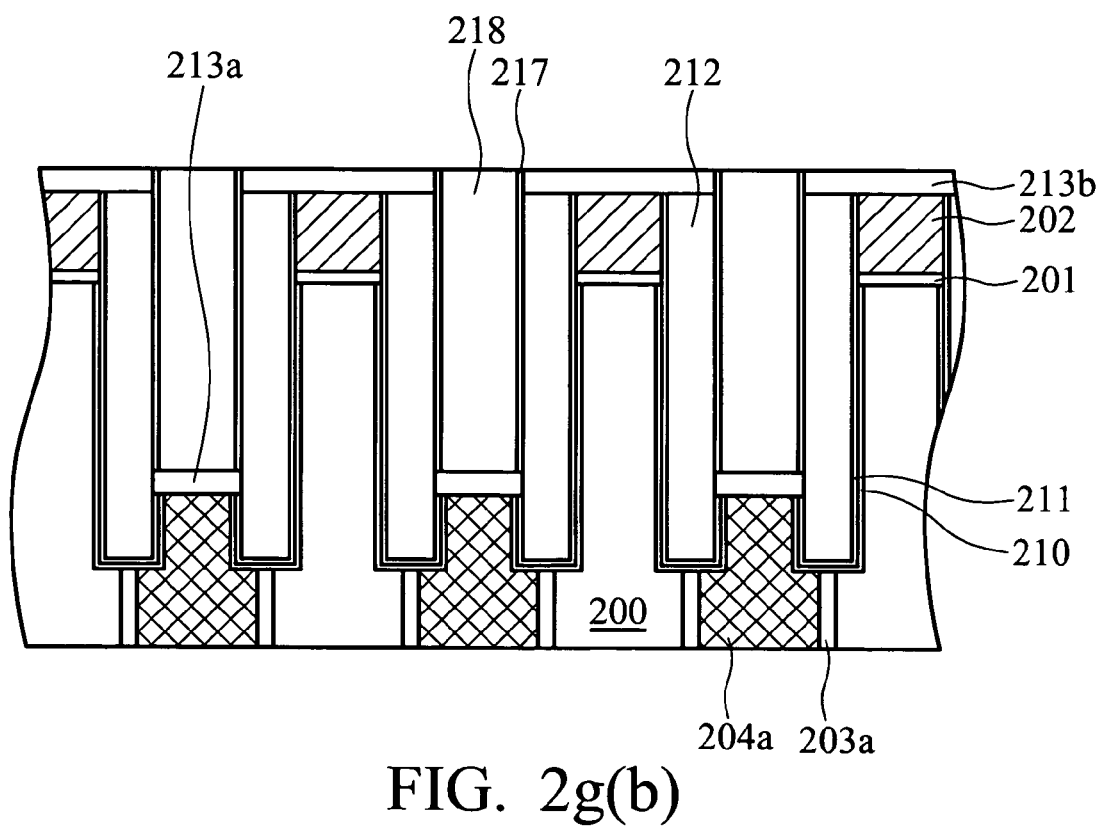

In FIGS. 2g(a) and 2g(b), the collar oxide layer 203 is recessed lower than the surface of the poly layer 204a to form a groove 214 between the conducting layer 204a and the sidewall of the trench 209.

A trench top insulating layer, such as a trench top oxide (TTO) layer, is formed on the surface of the structures in the bottom of the trench 209, the sidewall of the trench 209, and the pad nitride layer 202 by high density plasma chemical vapor deposition (HDP CVD). The oxide layer formed by HDP CVD on the horizontal surface is thicker than the vertical surface, such that the trench top insulating layer is anisotropically etched to remove the trench top insulating layer from the sidewall of the trench 209, and the trench top insulating layer 213a on the bottom of the trench 209 and the trench top insulating layer 213b on the pad nitride layer 203 remain. The trench top insulating layer insulates the conducting layer 204a and a gate of a transistor described in subsequently.

The semiconductor substrate 200 is thermally oxidized to diffuse the dopant from the conducting layer 204a to the semiconductor substrate 200 via the groove 214, such that an ion doped area 216 is formed.

The ion doped area 216 acts as a buried strap to electrically connect the conducting layer 204a and the gate of the transistor, and act as a drain of the transistor. The trench top insulating layer 213a is lower than the surface of the ion doped area 216, and exposes a portion thereof.

The semiconductor substrate 200 is thermally oxidized to form a conformable gate dielectric layer 217 on the sidewall of the trench 209a. A conducting layer, such as a doped poly layer, is formed on the trench top insulating layer 213b, and the trench 209 is filled with the conducting layer. The conducting layer is planarized to form a conducting layer 218, level with the trench top insulating layer 213b in height.

Figure 2H:
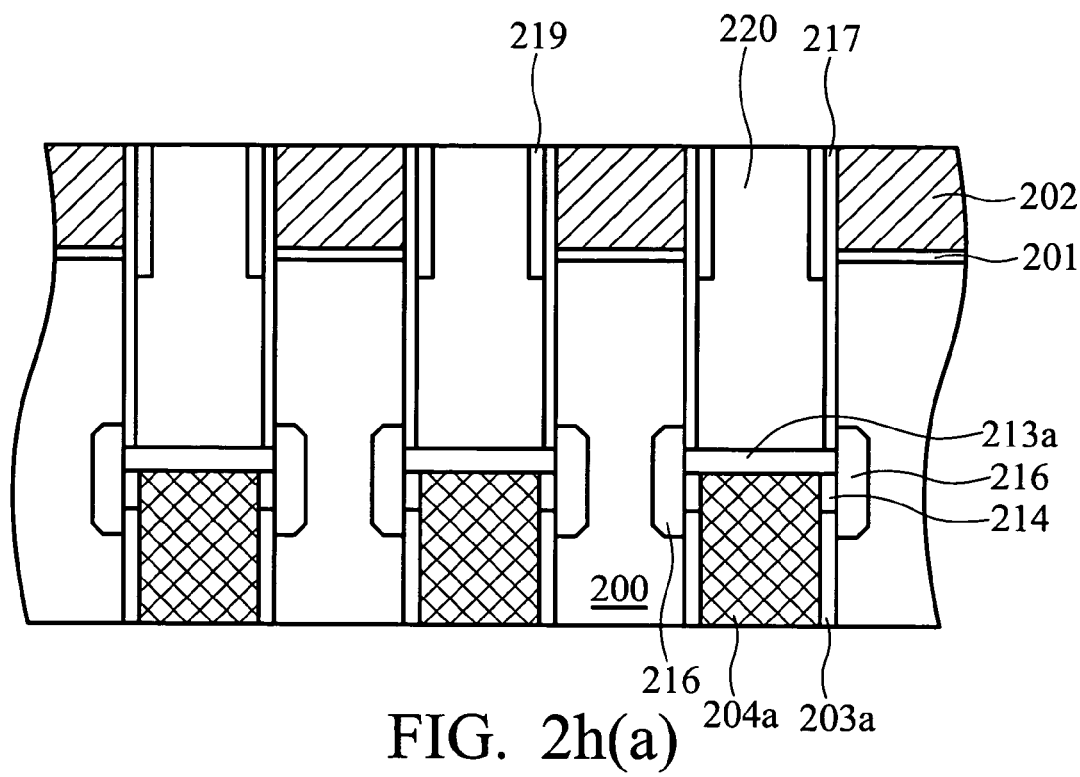
Figure 2H:
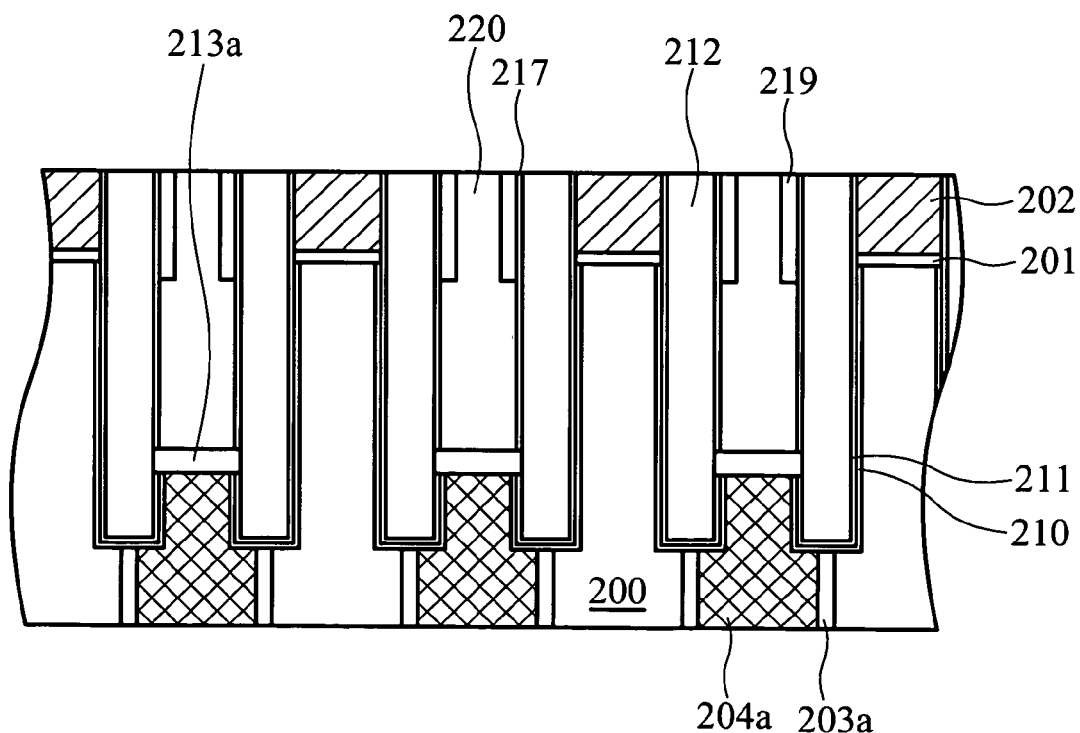

In FIGS. 2h(a) and 2h(b), the conducting layer 218 is etched to a predetermined depth. An insulating layer is conformably formed on the surface of the trench 209 and the trench top insulating layer 213b, and the insulating layer is anisotropic etched until the trench top insulating layer 213a is exposed to form a spacer 219 on the sidewall of the trench 209 above the trench top insulating layer 213a.

The trench top insulating layer 213b is then removed.

A conducting layer, such as a doped poly layer, is formed on the pad nitride layer 202, and the trench 209 is filled with the conducting layer. The conducting layer is planarized by CMP to expose the pad nitride layer, such that the conducting layer in the trench 209 is level with the trench 209. A conducting layer 220 comprises the conducting layer 218 and another conducting layer in the trench 209, and acts as a gate of a transistor.

The method for forming the isolation layer of the vertical DRAM of the present invention reversing the order of formation of the isolation layer 212 and the ion doped area 216, wherein the isolation 212 is formed before the ion doped area 216. Therefore, the quality of the liner oxide layer 210 is improved by thermal oxidation at a higher temperature, and the re-diffusion of the ion doped area 216 is avoided.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming an isolation layer in a vertical DRAM, comprising:
   providing a semiconductor substrate with a plurality of first trenches, a conformable collar dielectric layer formed on a sidewall of each, and a first conducting layer formed in each of the first trenches;
   forming a pattern mask layer with a plurality of openings over the semiconductor substrate, the collar dielectric layers, and the first conducting layers;
   etching the semiconductor substrate, the collar dielectric layers, and the first conducting layers to form a plurality of second trenches;
   removing the patterned mask layer;
   filling an insulating layer in each second trench acting as an isolation layer;
   etching the first conducting layers to a predetermined depth using the isolation layers acting as etching masks to form a plurality of grooves;
   filling a doped conducting layer in each groove;
   diffusing the doped conducting layers to form a doped area acting as a buried strap in the semiconductor substrate beside each groove;
   forming a trench top insulating layer over the first conducting layers and the doped conducting layers; and
   filling a second conducting layer in each trench acting as a gate.

2. The method for forming an isolation layer in a vertical DRAM of claim 1, wherein the collar dielectric layer is a collar oxide layer.

3. The method for forming an isolation layer in a vertical DRAM of claim 1, wherein each of the first conducting layers is a poly layer.

4. The method for forming an isolation layer in a vertical DRAM of claim 1, wherein the patterned mask layer is a photoresist layer, a borosilicate glass (BSG) layer, or a combination thereof.

5. The method for forming an isolation layer in a vertical DRAM of claim 1, wherein the insulating layer is an oxide layer.

6. The method for forming an isolation layer in a vertical DRAM of claim 1, wherein the doped conducting layer is a doped poly layer or an epi-silicon layer.

7. The method for forming an isolation layer in a vertical DRAM of claim 1, wherein the trench top insulating layer is a high density plasma (HDP) oxide layer.

8. The method for forming an isolation layer in a vertical DRAM of claim 1, wherein the second conducting layer is a doped poly layer.

9. The method for forming an isolation layer in a vertical DRAM of claim 1, further comprising a gate oxide layer between the second conducting layer and the surface of the first trench.

10. A method for forming an isolation layer in a vertical DRAM, comprising:
    providing a semiconductor substrate, a mask layer formed thereon;
    forming a plurality of first trenches in the semiconductor substrate;
    forming a conformable collar dielectric layer on a sidewall of each first trench, each filled with a first conducting layer;
    forming a patterned mask layer with a plurality of openings on the mask layer, the collar dielectric layers, and the first conducting layers;
    etching the mask layer, the collar dielectric layers, the first conducting layers, and the semiconductor substrate using the patterned mask layer as an etching mask to form a plurality of second trenches;
    removing the patterned mask layer;
    forming a liner layer on a sidewall of each second trench;
    forming an insulating layer on the semiconductor substrate, filling each second trench;
    planarizing the insulating layer, leaving the insulating layer in each second trench, acting as an isolation layer;
    etching each of the first conducting layers to a predetermined depth using the mask layer and the isolations as etching masks to form a plurality of grooves;
    filling a doped conducting layer in each groove, and diffusing the semiconductor substrate to form a doped area acting as a buried strap in the semiconductor substrate beside each groove;

conformably forming a top trench insulating layer on the surface of the mask layer and each first trench by high density plasma chemical vapor deposition (HDP CVD);

removing each top trench insulating layer from a sidewall of each first trench;

forming a gate dielectric layer on the sidewall of each first trench;

forming a second conducting layer on the semiconductor substrate, filling each first trench; and sequentially planarizing the second conducting layer and each top trench insulating layer until the mask layer is exposed to leave the second conducting layer in each first trench, acting as a gate.

11. The method for forming an isolation layer in a vertical DRAM of claim 10, wherein the mask layer is a pad nitride layer, a pad oxide layer, or a combination thereof.

12. The method for forming an isolation layer in a vertical DRAM of claim 10, wherein the collar dielectric layer is a collar oxide layer.

13. The method for forming an isolation layer in a vertical DRAM of claim 10, wherein each of the first conducting layers is a poly layer.

14. The method for forming an isolation layer in a vertical DRAM of claim 10, wherein the patterned mask layer is a borosilicate glass (BSG) layer.

15. The method for forming an isolation layer in a vertical DRAM of claim 10, wherein the patterned mask layer is removed by wet etching by HF.

16. The method for forming an isolation layer in a vertical DRAM of claim 10, wherein the liner layer is a liner oxide layer formed by thermal oxidation.

17. The method for forming an isolation layer in a vertical DRAM of claim 10, wherein the insulating layer is an oxide layer.

18. The method for forming an isolation layer in a vertical DRAM of claim 10, wherein planarization uses chemical mechanical polishing or etching.

19. The method for forming an isolation layer in a vertical DRAM of claim 10, wherein the doped conducting layer is a doped poly layer or an epi-silicon layer.

20. The method for forming an isolation layer in a vertical DRAM of claim 10, wherein the top trench insulating layer is a top trench oxide layer.

21. The method for forming an isolation layer in a vertical DRAM of claim 10, wherein the gate dielectric layer is a gate oxide layer formed by thermal oxidation.

22. The method for forming an isolation layer in a vertical DRAM of claim 10, wherein the second conducting layer is a doped poly layer.

* * * * *